United States Patent [19]

Persyn

[11] Patent Number: 5,800,616
[45] Date of Patent: Sep. 1, 1998

[54] VERTICAL LPCVD FURNACE WITH REVERSIBLE MANIFOLD COLLAR AND METHOD OF RETROFITTING SAME

[75] Inventor: Steven C. Persyn, Castroville, Tex.

[73] Assignees: Sony Corporation, Tokyo, Japan; Sony Electronics Inc., Park Ridge, N.J.

[21] Appl. No.: 990,670

[22] Filed: Dec. 15, 1997

[51] Int. Cl.⁶ .................................................. C23C 16/00
[52] U.S. Cl. ........................ 118/719; 118/715; 118/725; 428/34.1; 428/34.4; 29/401.1
[58] Field of Search ........................ 118/715, 719, 118/725; 29/401.1; 428/34.1, 34.4

[56] References Cited

U.S. PATENT DOCUMENTS

| | | |
|---|---|---|
| 5,458,685 | 10/1995 | Hasebe ........................... 118/725 |
| 5,458,688 | 10/1995 | Watanabe ........................ 118/728 |
| 5,478,609 | 12/1995 | Okamura ........................ 118/725 |
| 5,482,559 | 1/1996 | Imai ................................. 118/725 |

*Primary Examiner*—Richard Bueker
*Attorney, Agent, or Firm*—Wood, Herron & Evans, L.L.P.

[57] ABSTRACT

A reversible manifold collar design for use in a vertical low pressure chemical vapor deposition (LPCVD) furnace incorporates first and second notches in opposing ends thereof such that one of the notches aligns with an exhaust port in the deposition chamber of the furnace irrespective of the installed orientation of the collar. As such, blockage of the exhaust port, which might otherwise increase deposition rates and/or decrease film uniformity, may be avoided. Also, a method of retrofitting a LPCVD furnace includes removing an existing manifold collar and replacing it with a reversible manifold collar such that one of a pair of notches therein is adapted to align with an exhaust port irrespective of the orientation of the collar.

19 Claims, 2 Drawing Sheets

VERTICAL LPCVD FURNACE WITH REVERSIBLE MANIFOLD COLLAR AND METHOD OF RETROFITTING SAME

FIELD OF THE INVENTION

The invention generally relates to low pressure chemical vapor deposition and high purity furnaces in which to perform the same, and more particularly, to manifold collars for use in such furnaces.

BACKGROUND OF THE INVENTION

A number of chemical vapor deposition processes are utilized to deposit thin films on substrates. For example, in the semiconductor manufacturing industry, chemical vapor deposition may be utilized to deposit various films onto semiconductor wafers or other substrates.

Deposition of a silicon dioxide ($SiO_2$) insulation layer may be performed, for example, in a low pressure chemical vapor deposition (LPCVD) process in which a tetraethylorthosilicate (TEOS) vapor ($Si(OC_2H_5)_4$) undergoes pyrolysis when the vapor contacts a substrate in a low pressure and high temperature environment. Pyrolysis results in the decomposition of the TEOS vapor into silicon dioxide and several byproducts. Under carefully controlled heat and pressure conditions, the silicon dioxide deposits as a film on the substrate, whereas the other byproducts of the TEOS decomposition do not.

One suitable apparatus for depositing silicon dioxide on a substrate is a vertical LPCVD furnace such as the TEL VCF-615S LP-TEOS furnace available from Tokyo Electron Labs. With this furnace, a deposition chamber is formed by a bell-shaped chamber wall into which is disposed an inner sleeve that partitions the deposition chamber into central and annular regions. A space is provided between the inner sleeve and the top of the chamber wall. A boat of substrates such as silicon wafers is supported by a boat elevator and boat pedestal in the central region of the deposition chamber. A multi-zone heating element circumscribes the deposition chamber, and a vacuum pump coupled to the deposition chamber through an exhaust port disposed in the chamber wall proximate the bottom thereof controls the pressure within the chamber.

In use, TEOS vapor is injected into the bottom zone of the chamber and within the central region defined by the inner sleeve. The vapor rises through the inner sleeve to contact the wafers and thereby deposit a silicon dioxide film thereon. The byproducts of this operation along with any residual TEOS vapor are then drawn back down through the annular region between the inner sleeve and the chamber wall to exit through the exhaust port.

The deposition rate and film uniformity using this process are greatly dependent upon the environmental uniformity in the deposition chamber. Achieving uniformity in the bottom zone of the chamber is of particular importance, given that the TEOS vapor is injected into this zone while at a relatively cooler temperature, which may affect the temperature in this zone of the chamber.

The furnace relies on a manifold collar, typically formed of a non-reactive and thermally resistant material such as high purity quartz, that is mounted between the inner sleeve and the chamber wall proximate the bottom zone to act as a thermal mass and thereby minimize any transient temperature variations. The manifold collar is typically formed from an annular body such as a cylindrical sleeve. A vertically-oriented slot runs between opposing ends of the annular body to receive a nitrogen injector and thermocouple mount that extend between the inner sleeve and chamber wall. Moreover, a notch is formed in the manifold collar at one end thereof to expose the exhaust port in the chamber wall.

The thermal resistivity of the manifold collar substantially improves bottom zone uniformity. However, it has been found that it is possible to inadvertently install the manifold collar in an inverted (upside down) orientation. In particular, the slot formed in the manifold collar adequately aligns the collar with the nitrogen injector and thermocouple mount irrespective the particular orientation of the collar. However, if the manifold collar is installed in an inverted orientation relative to the correct orientation, the notch formed at the end of the collar no longer aligns with the exhaust port, thereby restricting flow to the port. Misalignment of the notch has the effect of increasing the ambient pressure within the chamber as well as increasing the resident time of the TEOS vapor. As a result, increased deposition rates and poor film thickness uniformity are usually obtained. Moreover, due to the ease in which the manifold collar may be installed in the inverted position, and given the numerous other failures in a furnace that can generate similar problems, the incorrect installation of the manifold collar may be extremely difficult to diagnose and may cause substantial down time and productivity losses.

Consequently, a significant need exists for a manner of preventing improper installation of a manifold collar within a vertical LPCVD furnace, particularly in a way which minimizes the modifications, if any, required in the furnace.

SUMMARY OF THE INVENTION

The invention addresses these and other problems associated with the prior art in providing a novel reversible manifold collar design that incorporates a second notch in an opposing end of the collar such that the second notch aligns with the exhaust port when the collar is inadvertently installed in an inverted orientation. As such, blockage of an exhaust port, and the attendant increased deposition rates and worsened film uniformity, are avoided as a result of inverted installation. The manifold collar may be fully reversible, such that features that are aligned at given locations when the manifold collar is installed in one orientation are essentially duplicated as necessary such that similar features are similarly aligned when the collar is installed in an inverted position. Alternately, the manifold collar need not be purely symmetrical, but may only include the additional notch or any other additional features required to ensure correct operation of the furnace irrespective of the orientation of the manifold collar.

The invention further provides a method of retrofitting a LPCVD furnace by removing an existing manifold collar and replacing it with a reversible manifold collar having first and second notches such that one of the notches is adapted to align with the exhaust port irrespective of the orientation of the collar. Often, no other modifications to the furnace are required in utilizing the reversible collar. Consequently, existing designs may be retrofitted in a simple and cost-effective manner. The invention also provides another method of retrofitting a LPCVD furnace by removing an existing manifold collar, forming a second notch in the collar at the appropriate location, and then re-installing the collar in either of its upright and inverted orientations.

These and other advantages and features, which characterize the invention, are set forth in the claims annexed hereto and forming a further part hereof. However, for a better understanding of the invention, and of the advantages and objectives attained through its use, reference should be made to the Drawing, and to the accompanying descriptive matter, in which there is described exemplary embodiments of the invention.

DETAILED DESCRIPTION

Figure 1:
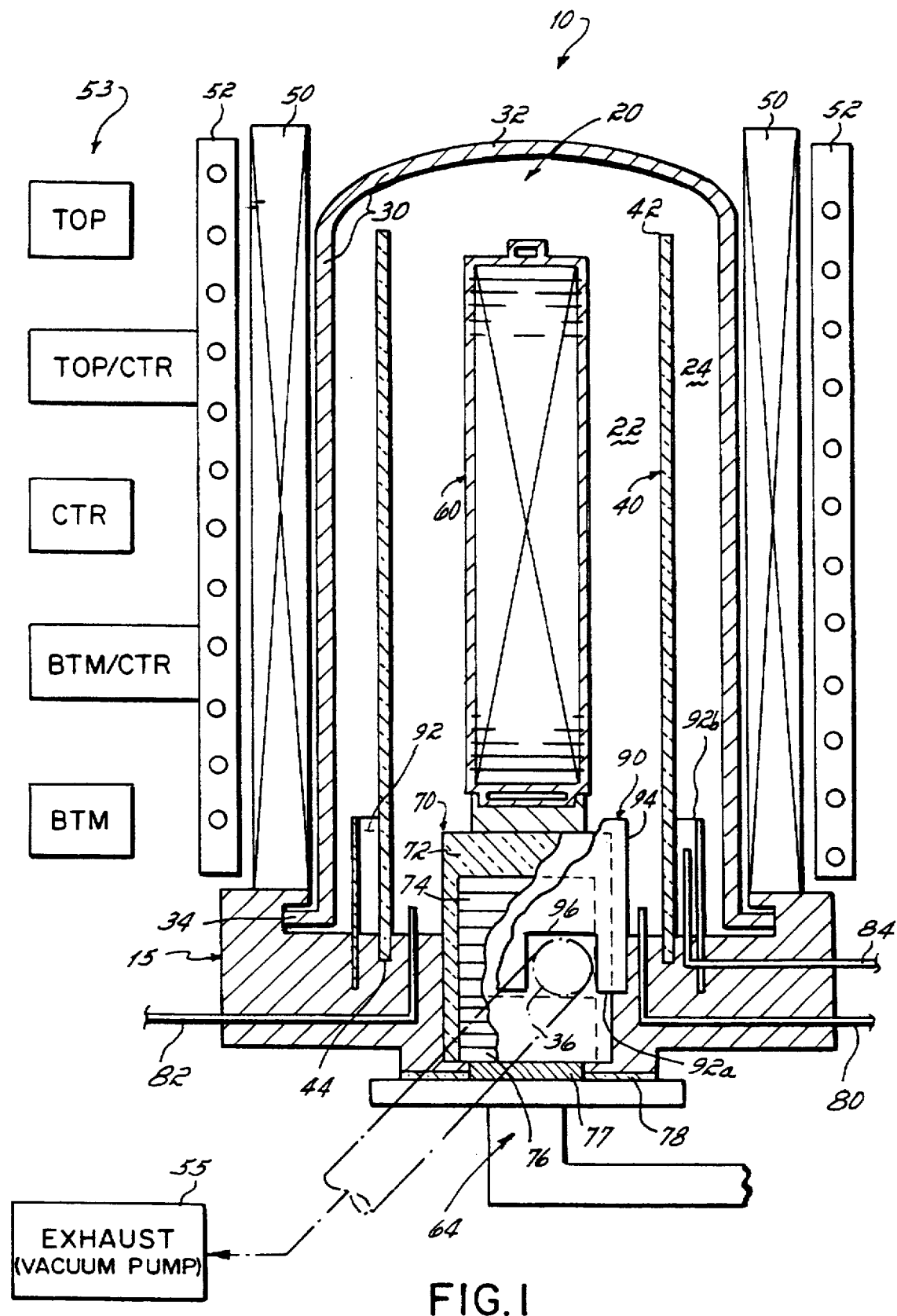
FIG. 1 is a functional schematic diagram of a vertical LPCVD furnace consistent with the principles of the invention.

Turning to the Drawing, wherein like numbers denote like parts throughout the several views, FIG. 1 illustrates a vertical low pressure chemical vapor deposition (LPCVD) furnace 10 consistent with the principles of the invention. Furnace 10 is illustrated as a TEL VCF-615S LP-TEOS available from Tokyo Electron Labs. However, it should be understood that other vertical chemical vapor deposition furnaces may also be used consistent with the invention. Therefore, while the embodiments described hereinafter are specifically adapted for this particular furnace, it should be appreciated that various modifications may be made to these embodiments as may be dictated by other furnace designs.

The furnace components relevant to an understanding of the invention are illustrated in FIG. 1. In particular, furnace 10 includes a deposition chamber 20 which is defined by a chamber wall 30 having a top end 32, bottom end 34, and an exhaust port 36 formed therein for placing the deposition chamber in fluid communication with a vacuum pump illustrated diagrammatically at 55. An inner sleeve 40, which is typically cylindrical in shape, is disposed within deposition chamber 20 to partition the same into central and annular regions 22, 24. A manifold 15 supports chamber wall 30 and inner sleeve 40.

Chamber wall 30 is open at its bottom end 34 but is closed at its top end 32 to define a bell shape. Inner sleeve 40 is open at its top and bottom ends 42, 44 such that the central and annular regions 22, 24 of deposition chamber 20 are in fluid communication with one another proximate top end 42. Both chamber wall 30 and inner sleeve 40 are formed of a non-reactive, and thermally resistant and high purity material such as quartz, although other suitable materials such as silicon carbide may be used in the alternative.

A heating element illustrated diagrammatically at 50 is coiled around deposition chamber 20. A cooling jacket 52 insulates heating element 50, and the entire assembly is mounted within a furnace frame (not shown). Heating element 50 is typically a multi-zone heating element partitioned as illustrated at 53 to provide greater control over the ambient temperature throughout the deposition chamber. Without separate zones, heat rising effects and gas flow dynamics can make it difficult to obtain a uniform temperature and deposition rate throughout the furnace.

For example, a five zone heating element may be utilized, with separate top, top center, center, bottom center and bottom zones shown at 53 and defined in the deposition chamber. As will become more apparent hereinafter, a significant concern with such furnaces is in maintaining uniformity within the bottom zone, as it is this zone where gases such as TEOS may be injected and disrupt static conditions established in the bottom zone.

The substrates upon which are to be deposited a silicon dioxide film, typically silicon wafers or other semiconductor substrates at various stages of manufacture, are housed in a boat 60. For example, boat 60 may be configured to support 170 silicon wafers in an overlapping but spaced apart relationship, with each wafer oriented horizontally and spaced apart from adjacent wafers by about 4.76 millimeters.

Boat 60 is inserted and removed from deposition chamber 20 by a boat elevator 64. A boat pedestal assembly 70 supports boat 60 on boat elevator 64. Assembly 70 includes a quartz pedestal 72 within which is housed a plurality (e.g., seven) of thin quartz fins 74 on top of a plurality (e.g., five) of thin quartz fins 76, both of which act as thermal masses and operate to insulate a metal pedestal support 77 from the heat in deposition chamber 20. Pedestal support 77 is mounted on a quartz dust plate 78 which is in turn mounted on boat elevator 64. Between cycles of furnace 10, boat elevator 64 is utilized to remove a boat from the deposition chamber, and then subsequently insert a new boat within the chamber for the next cycle, in a manner well known in the art.

FIG. 1 also illustrates a number of injectors and ports in fluid communication with deposition chamber 20. A TEOS injector 80 terminates in a quartz tube to outlet a TEOS vapor into the bottom zone of the deposition chamber within the central region 22 thereof. In some processes, oxygen may also be injected into the deposition chamber concurrently with the TEOS vapor. An injector 82 may be used to flow nitrogen and/or oxygen into the central region of the chamber. A nitrogen injector 84 terminates in the deposition chamber within the annular region 24 to supply nitrogen for the purpose of generating an inert atmosphere within the furnace during start up. Moreover, as discussed above, an exhaust port 36 outlets to annular region 24 proximate the bottom end 34 of chamber wall 30 to place the deposition chamber in fluid communication with vacuum pump 55.

Figure 2:
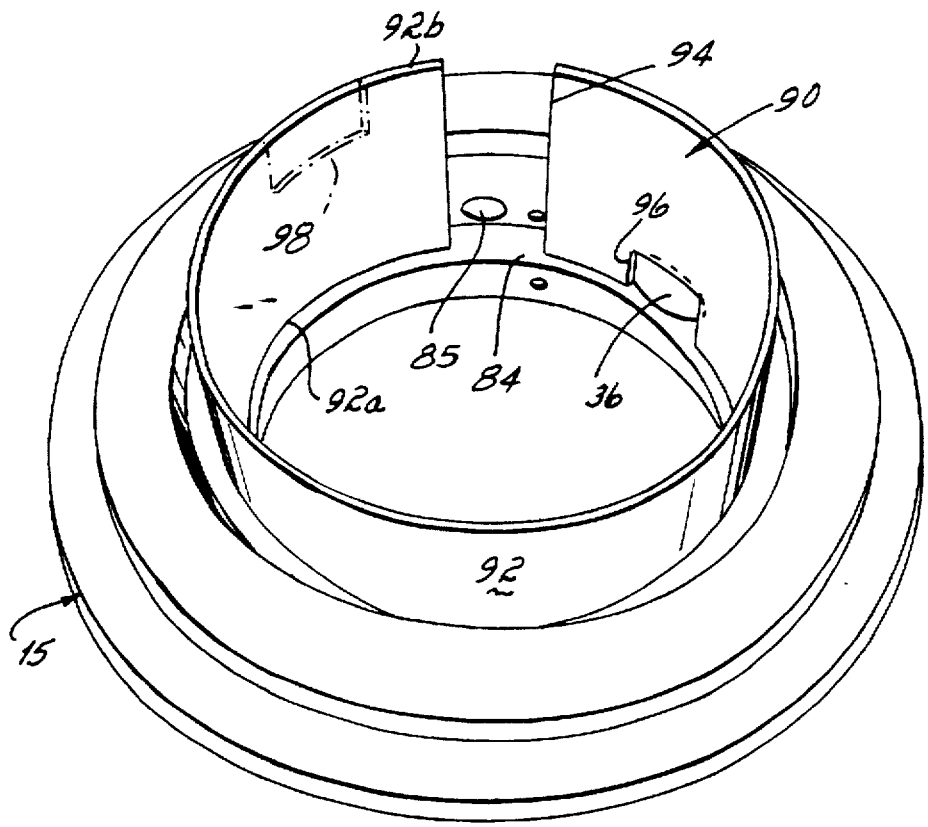
FIG. 2 is a perspective view of a conventional manifold collar mounted in an operative position within the manifold for the furnace of FIG. 1, with one suitable modification to the manifold collar consistent with the invention illustrated in phantom.

Moreover, as discussed above, a manifold collar 90 is typically installed between chamber wall 30 and inner sleeve 40 proximate the bottom ends 34, 44 thereof, and on top of the manifold 15. As best shown in FIG. 2, a conventional manifold collar 90 includes an annular body 92 (typically a cylindrical sleeve), formed of quartz, silicon carbide, or another non-reactive and thermally resistant material. A slot 94 extends between a first, bottom end 92a and a second, top end 92b of body 92, and is adapted to receive nitrogen injector 84 as well as a thermocouple mount 85. In addition, a notch 96 is provided proximate end 92a. Notch 96 is radially located on collar 90 such that when it is installed in its upright position shown in FIG. 2, notch 96 aligns with exhaust port 36 to place the exhaust port in fluid communication with the deposition chamber. However, as also mentioned above, if collar 90 is installed in an inverted position (i.e. with first end 92a pointing up), notch 96 is no longer aligned with the exhaust port, whereby body 92 overlaps the exhaust port and restricts flow between the vacuum pump and deposition chamber via the exhaust port.

Figure 3:
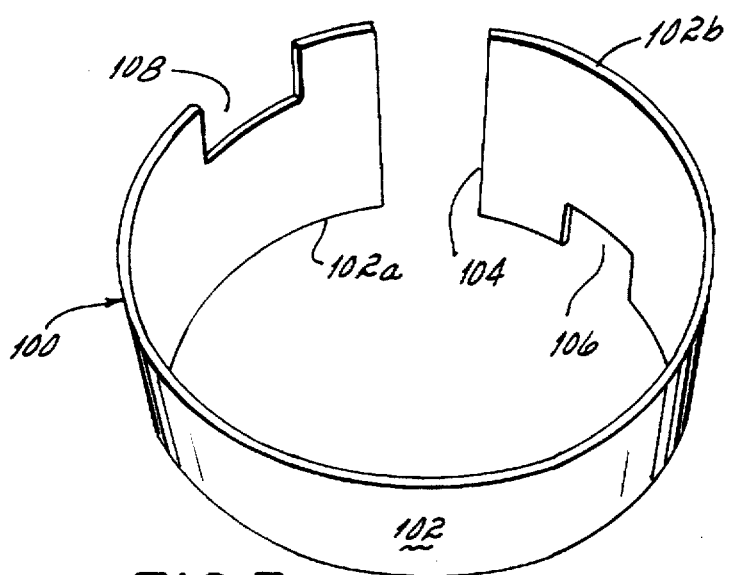
FIG. 3 is a perspective view of a reversible manifold collar consistent with the invention.

FIG. 3 shows a reversible manifold collar 100 consistent with the invention, which may be utilized to replace the conventional manifold collar 90 such that the manifold collar will not restrict flow to the exhaust port irrespective of which orientation the manifold collar is installed. Similar to manifold collar 90, manifold collar 100 includes an annular body 102 (typically a cylindrical sleeve) formed of quartz or another suitable non-reactive and thermally resistant material. Slot 104 is utilized to align with nitrogen injector 84 as well as thermocouple mount 85 (FIG. 2). A first notch 106 is formed in body 102 proximate a first, bottom end 102a, and is radially oriented on the collar such that, when the collar is installed in the upright orientation as shown in FIG. 3, the notch aligns with exhaust port 36 to place the vacuum pump in fluid communication with the deposition chamber. Manifold collar 100 further includes a second notch 108, formed in body 102 proximate the top end 102b thereof, which is radially oriented on the collar such that, if the manifold collar is installed in an inverted orientation (i.e. with bottom end 102a facing up), notch 108 aligns with exhaust port 36. Accordingly, the particular orientation of manifold collar 100 is typically not a concern since unrestricted flow is permitted through the exhaust port in either orientation.

Returning to FIG. 1, to perform a deposition cycle with furnace 10, boat 60 is loaded into the deposition chamber via boat elevator 64, then the deposition chamber is sealed and the vacuum pump 55 is activated to generate a vacuum within deposition chamber 20. A leak check is then performed and, if successful, nitrogen is flowed into the deposition chamber through injector 84, with vacuum pump 55 maintaining a pressure of between 100 mTorr and 800 mTorr, typically about 500 mTorr. In addition, heating element 50 is activated to maintain a temperature within the deposition chamber of about 650°–900° C.

Once these ambient conditions are established, nitrogen is turned off and TEOS vapor is injected into deposition chamber 20 through injector 80, whereby the vapor enters the furnace at the bottom zone thereof within central region 22. The vapor then rises through the process zone and undergoes pyrolysis whenever the vapor touches a hot surface, thereby depositing silicon dioxide on the surface. The byproducts formed by pyrolysis, as well as any residual TEOS vapor, are then drawn down through annular region 24 by virtue of the controlled airflow dynamics established by vacuum pump 55 through exhaust port 36.

Under controlled ambient conditions, silicon dioxide may be deposited on the wafers at a controlled rate, whereby the TEOS vapor supply may be shut off once the desired silicon dioxide film thickness is obtained. Typically, with the configuration illustrated in FIG. 1, silicon dioxide may be deposited with a film thickness of 100–10,000 Å with better than 4% uniformity. It should be understood that the uniformity of a film is defined as the difference between the maximum and minimum thickness of the film divided by twice the average thickness of the film.

The reversible manifold collar 100 described herein has a number of significant advantages over conventional non-reversible manifold collars. Most notably, the reversible manifold collar eliminates the concern as to improper installation of the collar, as the collar performs its primary function, that of acting as a thermal mass, in an identical manner in either orientation, and without ever blocking the exhaust port. Moreover, utilizing the manifold collar in an existing furnace requires no modifications to the furnace, such that a furnace may be retrofitted with the manifold collar simply by removing the existing manifold collar and replacing it with the reversible design.

In another embodiment, it may also be desirable to retrofit an existing single notch manifold collar to add a second notch located on the opposite end thereof and thereby convert the manifold collar to a reversible design. For example, it may be possible to cut a second notch 98 in manifold collar 90 as shown in phantom in FIG. 2.

In such an embodiment, the existing manifold collar is removed from the furnace, the second notch is formed thereon, and then the collar is re-installed in the furnace in either of its upright and inverted orientations. Formation of the second notch in the manifold collar may be performed, for example, through conventional cutting operations such as diamond tip sawing or torch cutting, among others.

Therefore, it should be appreciated that the invention provides significant advantages in terms of reliability and uniformity in low pressure chemical vapor deposition processes. Various modifications may be made to the above-described embodiments without departing from the spirit and scope of the invention. Therefore, the invention lies in the claims hereinafter appended.

What is claimed is:

1. A reversible manifold collar for use in a vertical low pressure chemical vapor deposition furnace of the type including a deposition chamber defined by a chamber wall and partitioned by an inner sleeve disposed therein, and an exhaust port disposed in the chamber wall in fluid communication with the deposition chamber, the manifold collar comprising:

(a) an annular body forming a thermal mass and adapted to mount between the inner sleeve and chamber wall of the furnace;

(b) a first notch defined in the annular body at a first end thereof and adapted to align with the exhaust port of the furnace when the annular body is mounted in a first, upright orientation within the furnace; and (c) a second notch defined in the annular body at a second end thereof and adapted to align with the exhaust port of the furnace when the annular body is mounted in a second, inverted orientation within the furnace.

2. The manifold collar of claim 1, wherein the annular body includes a cylindrical sleeve.

3. The manifold collar of claim 2, wherein the cylindrical sleeve is formed of quartz.

4. The manifold collar of claim 1, further comprising a slot fully extending between the first and second ends of the annular body and adapted to align with at least one of a nitrogen injector and a thermocouple mount in the furnace.

5. The manifold collar of claim 1, wherein the first notch is rectangular in shape.

6. The manifold collar of claim 1, wherein the second notch is rectangular in shape.

7. A method of retrofitting a vertical low pressure chemical vapor deposition furnace, comprising:

(a) removing an existing manifold collar from the furnace, the existing manifold collar including an annular body forming a thermal mass and adapted to mount between a chamber wall and an inner sleeve disposed therein, and a notch defined on only one end of the annular body to align with an exhaust port for the furnace only when the existing manifold collar is mounted in an upright orientation within the furnace; and (b) installing a reversible manifold collar into the furnace, the reversible manifold collar including an annular body and first and second notches respectively defined at first and second ends of thereof such that one of the first and second notches is adapted to align with the exhaust port irrespective of whether the annular body is mounted in the upright orientation or in an inverted orientation within the furnace.

8. The method of claim 7, wherein the annular body of the reversible manifold includes a cylindrical sleeve formed of quartz.

9. The method of claim 7, wherein the annular body of the reversible manifold further includes a slot extending between the first and second ends thereof and adapted to align with at least one of a nitrogen injector and a thermocouple mount in the furnace.

10. The method of claim 7, wherein the first notch of the reversible manifold collar is rectangular in shape.

11. The method of claim 7, wherein the second notch of the reversible manifold collar is rectangular in shape.

12. A method of retrofitting a vertical low pressure chemical vapor deposition furnace, comprising:
   (a) removing a manifold collar from the furnace, the manifold collar including an annular body forming a thermal mass and adapted to mount between a chamber wall and an inner sleeve disposed therein, and a single notch defined on a first end of the annular body to align with an exhaust port for the furnace when the manifold collar is mounted in a first, upright orientation within the furnace;
   (b) forming a second notch on a second end of the manifold collar annular body, the second notch adapted to align with the exhaust port for the furnace when the manifold collar is mounted in a second, inverted orientation within the furnace; and
   (c) re-installing the manifold collar into the furnace in either of the upright and inverted orientations.

13. A vertical low pressure chemical vapor deposition furnace, comprising:
   (a) a deposition chamber defined by a chamber wall;
   (b) an inner sleeve disposed within and partitioning the deposition chamber;
   (c) an exhaust port disposed in the chamber wall in fluid communication with the deposition chamber; and
   (d) a reversible manifold collar mounted between the inner sleeve and the chamber wall, the manifold collar comprising:
      (1) an annular body forming a thermal mass;
      (2) a first notch defined in the annular body at a first end thereof and adapted to align with the exhaust port when the annular body is mounted in a first, upright orientation; and
      (3) a second notch defined in the annular body at a second end thereof and adapted to align with the exhaust port when the annular body is mounted in a second, inverted orientation.

14. The furnace of claim 13, wherein the annular body includes a cylindrical sleeve formed of quartz.

15. The furnace of claim 13, wherein the first notch is rectangular in shape.

16. The furnace of claim 13, wherein the second notch is rectangular in shape.

17. The furnace of claim 13, further comprising a nitrogen injector in fluid communication with the deposition chamber between the chamber wall and the inner sleeve, and wherein the manifold collar further includes a slot defined between the first and second ends of the annular body and adapted to align with the nitrogen injector.

18. The furnace of claim 17, wherein the inner sleeve is vertically oriented and spaced at a top end thereof from a top wall of the deposition chamber, and wherein the exhaust port is disposed proximate a bottom zone of the deposition chamber, the furnace further comprising:
   (a) a heating element circumscribing the deposition chamber;
   (b) a vacuum pump in fluid communication with the deposition chamber through the exhaust port; and
   (c) a tetraethylortosilicate (TEOS) injector in fluid communication with the deposition chamber within the inner sleeve and proximate the bottom zone of the deposition chamber; whereby the vacuum pump draws fluid injected by the injector successively upward through the inner sleeve and downward between the chamber wall and the inner sleeve to the exhaust port.

19. The furnace of claim 18, further comprising a controller, coupled to the heating element, the vacuum pump, the TEOS injector, and the nitrogen injector, for controlling temperature and pressure within the deposition chamber at levels suitable for the controlled deposition of a silicon dioxide film on a semiconductor wafer disposed in the deposition chamber; whereby the reversible manifold collar maintains bottom zone uniformity irrespective of its mounted orientation in the furnace.

* * * * *